United States Patent
Kroener

(10) Patent No.: US 9,536,851 B2
(45) Date of Patent: Jan. 3, 2017

(54) PREFORM STRUCTURE FOR SOLDERING A SEMICONDUCTOR CHIP ARRANGEMENT, A METHOD FOR FORMING A PREFORM STRUCTURE FOR A SEMICONDUCTOR CHIP ARRANGEMENT, AND A METHOD FOR SOLDERING A SEMICONDUCTOR CHIP ARRANGEMENT

(71) Applicant: Infineon Technologies AG, Neubiberg (DE)

(72) Inventor: Friedrich Kroener, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/477,962

(22) Filed: Sep. 5, 2014

(65) Prior Publication Data

US 2016/0071814 A1   Mar. 10, 2016

(51) Int. Cl.
*B23K 35/14* (2006.01)
*H01L 23/00* (2006.01)
(Continued)

(52) U.S. Cl.
CPC ............ *H01L 24/29* (2013.01); *B23K 1/0016* (2013.01); *B23K 35/0233* (2013.01); *B23K 35/0238* (2013.01); *B23K 35/0244* (2013.01); *B23K 35/302* (2013.01); *B23K 35/32* (2013.01); *H01L 24/03* (2013.01); *H01L 24/05* (2013.01); *H01L 24/27* (2013.01); *H01L 24/32* (2013.01); *H01L 24/83* (2013.01); *B23K 2201/40* (2013.01); *H01L 24/06* (2013.01); *H01L 2224/03462* (2013.01); *H01L 2224/04026* (2013.01); *H01L 2224/05647* (2013.01); *H01L 2224/05747* (2013.01); *H01L 2224/05893* (2013.01); *H01L 2224/06181* (2013.01); *H01L 2224/271* (2013.01); *H01L 2224/276* (2013.01); *H01L 2224/2711* (2013.01); *H01L 2224/2712* (2013.01); *H01L 2224/2746* (2013.01); *H01L 2224/27442* (2013.01);
(Continued)

(58) Field of Classification Search
None
See application file for complete search history.

(56) References Cited

U.S. PATENT DOCUMENTS 3,316,086 A * 4/1967 Cape ................. B23K 35/3026
 420/434
4,083,719 A * 4/1978 Arakawa ................. C22C 49/14
 252/503
(Continued)

FOREIGN PATENT DOCUMENTS

CN 103915745 A * 7/2014
DE 102006043163 A1 3/2008
(Continued)

OTHER PUBLICATIONS

Ho et al. "Carbon fiber reinforced tin-lead alloy as a low thermal expansion solder preform", Jun. 1990, pp. 1266-1270.*

(Continued)

*Primary Examiner* — Kiley Stoner
(74) *Attorney, Agent, or Firm* — Shumaker & Sieffert, P.A.

(57) ABSTRACT

A preform structure for soldering a semiconductor chip arrangement includes a carbon fiber composite sheet and a solder layer formed over the carbon fiber composite sheet.

10 Claims, 3 Drawing Sheets

(51) Int. Cl.
*B23K 35/02* (2006.01)
*B23K 1/00* (2006.01)
*B23K 35/30* (2006.01)
*B23K 35/32* (2006.01)

(52) U.S. Cl.
CPC ............... *H01L 2224/2908* (2013.01); *H01L 2224/29082* (2013.01); *H01L 2224/29111* (2013.01); *H01L 2224/29139* (2013.01); *H01L 2224/29144* (2013.01); *H01L 2224/29147* (2013.01); *H01L 2224/29157* (2013.01); *H01L 2224/29193* (2013.01); *H01L 2224/29247* (2013.01); *H01L 2224/29271* (2013.01); *H01L 2224/29393* (2013.01); *H01L 2224/29447* (2013.01); *H01L 2224/29471* (2013.01); *H01L 2224/32013* (2013.01); *H01L 2224/32014* (2013.01); *H01L 2224/32057* (2013.01); *H01L 2224/32058* (2013.01); *H01L 2224/32245* (2013.01); *H01L 2224/831* (2013.01); *H01L 2224/8382* (2013.01); *H01L 2224/83101* (2013.01); *H01L 2224/83191* (2013.01); *H01L 2224/83192* (2013.01); *H01L 2224/83447* (2013.01); *H01L 2224/83693* (2013.01); *H01L 2224/83825* (2013.01); *H01L 2924/014* (2013.01); *H01L 2924/0105* (2013.01); *H01L 2924/0132* (2013.01); *H01L 2924/2064* (2013.01); *H01L 2924/20641* (2013.01); *H01L 2924/20642* (2013.01); *H01L 2924/20643* (2013.01); *H01L 2924/20644* (2013.01)

(56) References Cited

U.S. PATENT DOCUMENTS

| | | | | |
|---|---|---|---|---|
| 4,995,451 | A * | 2/1991 | Hamburgen | F28D 15/02 165/104.33 |
| 5,089,356 | A * | 2/1992 | Chung | B23K 35/0222 228/248.1 |
| 5,520,752 | A * | 5/1996 | Lucey, Jr. | B23K 35/262 148/400 |
| 6,706,219 | B2 * | 3/2004 | Nguyen | B23K 1/0016 106/1.21 |
| 7,916,493 | B2 | 3/2011 | Kroener et al. | |
| 8,025,783 | B2 | 9/2011 | Hellmund et al. | |
| 8,102,045 | B2 | 1/2012 | von Koblinski et al. | |
| 8,757,475 | B2 * | 6/2014 | Chaumat | B23K 35/0244 228/122.1 |
| 9,017,539 | B2 | 4/2015 | Kroener | |
| 9,017,598 | B2 * | 4/2015 | Menchhofer | C22C 32/0084 419/11 |
| 2002/0038704 | A1 * | 4/2002 | Houle | H01L 21/4882 165/185 |
| 2003/0131476 | A1 * | 7/2003 | Ocher | B22F 3/26 29/890.03 |
| 2003/0131975 | A1 * | 7/2003 | Houle | H01L 23/10 165/133 |
| 2004/0112478 | A1 * | 6/2004 | Bieler | B23K 35/262 148/538 |
| 2004/0241447 | A1 * | 12/2004 | Fukushima | C04B 41/009 428/408 |
| 2004/0262372 | A1 * | 12/2004 | Houle | B23K 1/0016 228/246 |
| 2006/0145334 | A1 * | 7/2006 | Tsukada | H01L 23/373 257/706 |
| 2008/0067630 | A1 | 3/2008 | Hellmund et al. | |
| 2009/0008769 | A1 | 1/2009 | Kroener | |
| 2009/0039501 | A1 | 2/2009 | von Koblinski et al. | |
| 2010/0052154 | A1 * | 3/2010 | Monfarad | H01L 21/4817 257/704 |
| 2014/0054020 | A1 * | 2/2014 | Kroener | F28F 21/085 165/185 |
| 2014/0057127 | A1 * | 2/2014 | Kroener | C25D 5/12 428/614 |
| 2015/0115452 | A1 * | 4/2015 | Yoon | H01L 24/29 257/762 |

FOREIGN PATENT DOCUMENTS

| | | |
|---|---|---|
| DE | 102005047106 B4 | 7/2009 |
| DE | 102005046710 B4 | 12/2012 |
| DE | 102008036285 B4 | 7/2013 |
| DE | 102013108869 A1 | 2/2014 |
| JP | 63165132 A * | 7/1988 |
| JP | 2005305526 A * | 11/2005 |

OTHER PUBLICATIONS

"Materials & Production Engineering," CCu Material Properties, Austrian Institute of Technology (formerly Austrian Research Centers), 15 pp. Publication date unknown, however, Applicant believes publication date to be on or before Jun. 2009.

Muri et al., "Electrolytic Process for Manufacturing of Carbon-Copper Heat Sinks on Microelectronic Wafers," Infineon, Vienna University of Technology, and Photonics Institute, May 2013, 1 pp.

"Brite Euram project, New Carbon fibre reinforced Copper Matrix Composites for an unique and new generation of electronic and electrical devices," Austrian Research Centers Seibersdorf, Materials & Production Engineering, 2000, 15 pp. (Applicant points out, in accordance with MPEP 609.04(a), that the year of publication, 2000, is sufficiently earlier than the effective U.S. filing date, Sep. 5, 2014, so that the particular month of publication is not an issue.

* cited by examiner

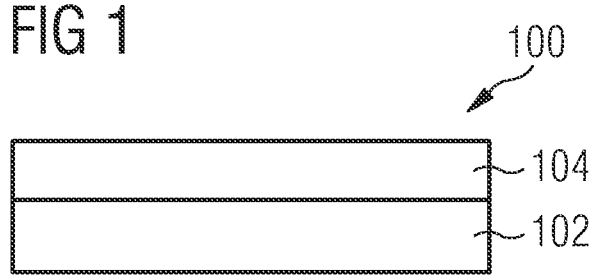
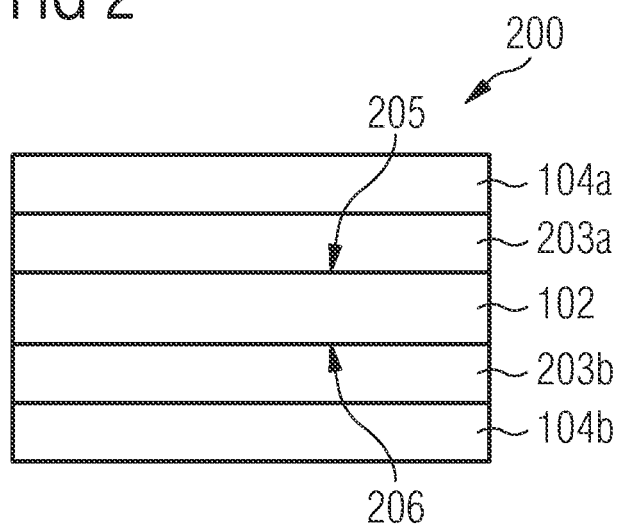
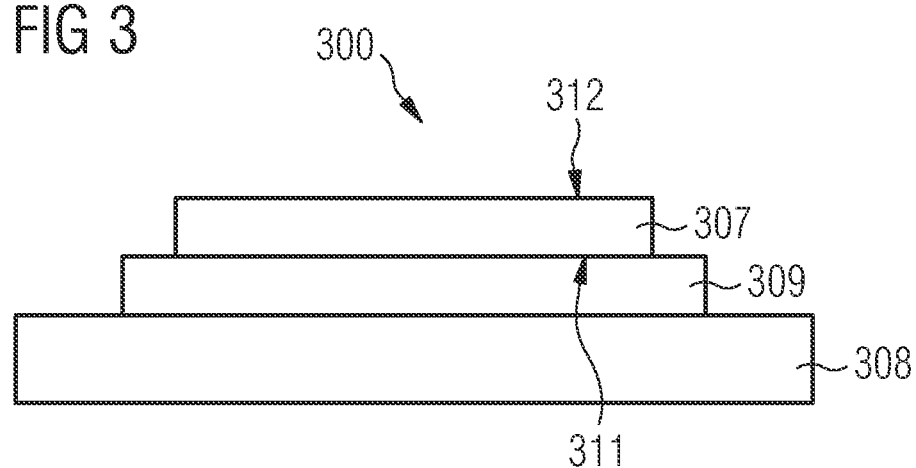

PREFORM STRUCTURE FOR SOLDERING A SEMICONDUCTOR CHIP ARRANGEMENT, A METHOD FOR FORMING A PREFORM STRUCTURE FOR A SEMICONDUCTOR CHIP ARRANGEMENT, AND A METHOD FOR SOLDERING A SEMICONDUCTOR CHIP ARRANGEMENT

TECHNICAL FIELD

Embodiments relate to soldering a semiconductor chip and in particular to a preform structure for soldering a semiconductor chip arrangement, a method for forming a preform structure for a semiconductor chip arrangement, and a method for soldering a semiconductor chip arrangement.

BACKGROUND

Temperature stress between a silicon chip and lead frame may be caused by solder connections. With soft solders, a solder alloy pad between the chip and the substrate may allow the chip to deform as long as the solder is liquid, which minimizes its internal temperature stress. However, with diffusion solders, other means may be required to retain the even shape of the chips, which may generate mechanical forces in addition to the temperature stress. These stresses are considerably large when compared to soft solders and may stay permanently in the individual layers of the chips.

SUMMARY

Some embodiments relate to a preform structure for soldering a semiconductor chip arrangement. The preform structure includes a carbon fiber composite sheet and a solder layer formed over the carbon fiber composite sheet.

Some embodiments relate to a method for forming a preform structure for a semiconductor chip arrangement. The method includes heat-pressing of carbon fibers and a supplementary material to obtain a carbon fiber composite sheet. The method further includes forming a preform structure based on the carbon fiber composite sheet.

Some embodiments relate to a method for soldering a semiconductor chip arrangement. The method includes arranging a preform structure between a semiconductor chip and a carrier structure. A surface area of a lateral side of the preform structure is smaller than a surface area of a lateral side of the semiconductor chip. The method further includes soldering the semiconductor chip arrangement.

BRIEF DESCRIPTION OF THE FIGURES

Some embodiments of apparatuses and/or methods will be described in the following by way of example only, and with reference to the accompanying figures, in which FIG. 1 shows a schematic illustration of a preform structure;

FIG. 2 show a schematic illustration of a further preform structure;

FIG. 3 shows a schematic illustration of a semiconductor chip arrangement;

DETAILED DESCRIPTION

Figure 4:
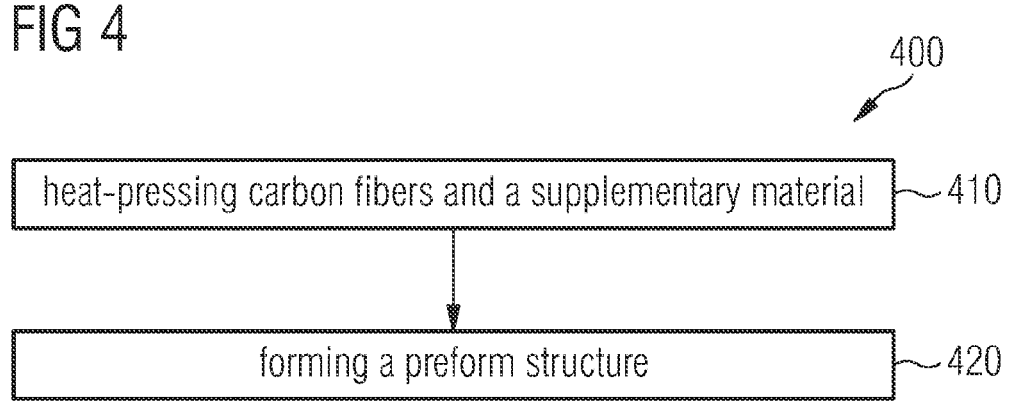
FIG. 4 shows a flow chart of a method for forming a preform structure.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a schematic illustration of a preform structure 100 for soldering a semiconductor chip arrangement according to an embodiment.

The preform structure 100 includes a carbon fiber composite sheet 102 and a solder layer 104 formed over the carbon fiber composite sheet 102.

Due to the inclusion of a carbon fiber composite sheet and a solder layer in a preform structure, temperatures stresses generated by solders used for soldering a semiconductor chip arrangements may be reduced. For example, the temperature stresses may be reduced due to a similarity of a coefficient of thermal expansion of the carbon fiber composite sheet with that of a semiconductor chip of the semiconductor chip arrangement. Furthermore, a preform structure which includes a carbon fiber composite sheet may provide both an electrically conductive and thermally conductive connection to a semiconductor chip arrangement.

The semiconductor chip arrangement to be soldered may include a semiconductor chip or a semiconductor die which may include part of a semiconductor substrate or wafer, for example. For example, the semiconductor chip (or die) may be diced or individualized from a semiconductor substrate or wafer comprising a plurality of semiconductor chips (or dies), so that the semiconductor chip arrangement has predefined lateral top and bottom sides or surfaces, each having a predefined lateral surface area. For example, a lateral surface area of a semiconductor chips may be 0.5 mm×0.5 mm or greater, e.g. 1 mm×1 mm or greater, or e.g. 10 mm×10 mm or greater. The semiconductor chip of the semiconductor chip arrangement may include one or more active or passive electrical elements or devices (e.g. transistors, diodes, or thyristors) formed in the semiconductor chip, for example. The semiconductor chip may include a semiconductor substrate which may be a silicon-based semiconductor substrate, a silicon carbide-based semiconductor substrate, a gallium arsenide-based semiconductor substrate or a gallium nitride-based semiconductor substrate, for example.

The semiconductor chip arrangement may also include a carrier structure, (e.g. lead frame, a board, or a circuit board) which may be soldered to the semiconductor chip via the preform structure. For example, a lead frame may be a copper alloy or a copper lead frame.

The preform structure 100 may be a pre-formed or pre-made structure, which may have one or more predetermined lateral dimensions, for example. For example, the preform structure may have a thickness which lies between 200 µm to 400 µm, e.g. between 250 µm to 400 µm, or e.g. between 275 µm to 350 µm. For example, the preform structure may have predefined lateral top and bottom sides having a predefined lateral surface area. Depending on the application, a surface area of a lateral side or surface of the preform structure 100 may be selected. In some examples, a surface area of a lateral side or surface of the preform structure 100 may be about equal to or larger than a surface area of the lateral side or surface of a semiconductor chip of the semiconductor chip arrangement to be soldered. In other examples, a surface area of a lateral side or surface of the preform structure 100 may be smaller than a surface area of the lateral side or surface of a semiconductor chip of the semiconductor chip arrangement to be soldered.

The carbon fiber composite sheet 102 may include a mixture of carbon fibers and copper and/or chromium, heat-pressed to form the carbon fiber composite sheet 102. The carbon fiber composite sheet 102 of the preform structure 100 may be a heat-pressed composite sheet, and may have, for example, a first lateral side or surface and a second lateral side or surface. For example, a lateral length or breadth of the first lateral side and the second lateral side may be greater than a thickness off the carbon fiber composite sheet. For example, a lateral length or breadth of the first lateral side and the second lateral side may be greater than 10 times or e.g. greater than 100 times, or e.g. greater than 500 times the thickness of the carbon fiber composite sheet. The carbon fiber composite sheet may have a thickness which lies between 50 µm to 250 µm, e.g. between 50 µm to 200 µm, or e.g. between 100 µm to 175 µm. For example, the carbon fiber composite sheet may include between 50% to 80%, e.g. between 55% to 75%, or e.g. between 60% to 70% copper or chromium.

The preform structure 100 may include a solder material layer for soldering the semiconductor chip arrangement, for example. For example, the solder layer 104 may include gold-tin or silver-tin. The semiconductor chip may be diffusion soldered to the lead frame via the preform structure (e.g. via the solder layer 104 of the preform structure), for example. The solder layer 104 may be deposited on (e.g. directly or indirectly) the carbon fiber composite sheet 102.

By carrying out one or more polishing processes of the carbon fiber composite sheet 102 (e.g. before depositing the solder layer), a surface roughness of the solder layer 104 formed over the carbon fiber composite sheet 102 may be less than 2 µm, or e.g. less than 1.5 µm, or e.g. less than 1 µm, for example. Optionally or additionally, the solder layer 104 may be deposited over a side of the semiconductor chip to be soldered or over a side of the lead frame to be soldered instead of or in addition to being deposited over the carbon fiber composite sheet 102, for example.

Due to the use of a preform structure including a carbon fiber composite sheet for soldering a semiconductor chip arrangement, temperatures stresses generated by the solders may be reduced, for example. Furthermore, such a preform structure may provide both an electrically conductive and thermally conductive connection (e.g. greater than about 100 W/mK, or e.g greater than about 1000 W/mK, or e.g greater than about 2000 W/mK) between a semiconductor chip arrangement and a lead frame, and may be used for carrying or passing electrical signals between the semiconductor chip and the lead frame, for example.

FIG. 2 shows a schematic illustration of a preform structure 200 according to an embodiment. The preform structure 200 may be similar to the preform structures described with respect to FIG. 1.

The preform structure 200 may include a carbon fiber composite sheet 102 which may have a first lateral side 205 or surface and a second lateral side 206 or surface. The preform structure 200 may include an electrically conductive layer 203a formed between the carbon fiber sheet 102 and the solder layer.

For example, the electrically conductive layer 203a may be formed between the carbon fiber composite sheet 102 and the solder layer 104a at the first lateral side 205 of the carbon fiber composite sheet 102. For example, the electrically conductive layer 203a may be formed over or directly on a first lateral side 205 of the carbon fiber composite sheet 102 and a first solder layer 104a may be formed over or directly on the first electrically conductive layer 203a.

Optionally or additionally, a second electrically conductive layer 203b may be formed between the carbon fiber composite sheet 102 and a second solder layer 104b at the second lateral side 206 of the carbon fiber composite sheet 102. The second lateral side 206 may be opposite to the first lateral side 205 of the carbon fiber composite sheet. For example, the second electrically conductive layer 203b may be formed over or directly on the second lateral side 206 of the carbon fiber composite sheet 102 and the second solder layer 104b may be formed over or directly on the second electrically conductive layer 203b.

It may be possible that the electrically conductive layer may include one or more intermediate electrically conductive layers in an electrically conductive layer stack. The electrically conductive layer may cover at least partially, substantially or completely the first lateral side 205 and/or the second lateral side 206 of the carbon fiber composite sheet.

The solder layer (e.g. 104a or 104b respectively) may cover at least partially or completely the electrically conductive layer (e.g. 203a or 203b respectively). The solder layer, which may include gold-tin or silver-tin may include one or more intermediate solder layers if necesarry. For example, a first intermediate layer of tin formed over (or directly on) the electrically conductive layer may have a thickness which lies between 1 μm to 2 μm or e.g. between 1.2 μm to 1.8 μm. A thicknesses smaller than 1 μm may lead to the uneven surfaces of lead frames being replaced by CMP polished surfaces due to their high roughness (a best case of root mean square r.m.s 0.5 μm). Thicknesses greater than 2 μm may lead to longer soldering times, and additional effects which may be difficult to control.

A further intermediate layer of silver or gold which may protect against corrosion formed over (or directly on) the intermediate layer of tin may have a thickness which lies between 0.5 μm to 5 μm, or e.g. between 0.5 μm to 1 μm. The surface roughness of the preform structure may be less than the thickness of the solder layer, e.g. the tin layer, for example.

A lateral size of the preform structure 200 (before soldering) may be selected compared to a lateral size of the semiconductor chip. For example, the lateral size of the preform structure 200 may be equal to or within +/−10%, or e.g. +/−5%, or e.g. +/−2% of the lateral size of the semiconductor chip. For example, a length of one (or each) lateral side of the preform structure 200 may be about 10 μm or e.g. about 20 μm, or e.g. about 50 μm larger or smaller than a length of one (or each) lateral side of the semiconductor chip.

More details and aspects are mentioned in connection with the embodiments described above or below (e.g. the preform structure, the semiconductor chip arrangement, the carbon fiber composite sheet, the electrically conductive layer, the lateral sides of the carbon fiber composite sheet and the solder layer). The embodiment shown in FIG. 2 may comprise one or more optional additional features corresponding to one or more aspects mentioned in connection with the proposed concept or one or more embodiments described above (e.g. FIG. 1) or below (e.g. FIGS. 3 to 5C).

FIG. 3 shows a semiconductor chip arrangement 300 according to an embodiment.

The semiconductor chip arrangement 300 includes a semiconductor chip 307 and a lead frame 308. The semiconductor chip arrangement 300 further includes an intermediate solder layer 309 including carbon fibers. The semiconductor chip is electrically connected to the lead frame through the intermediate solder layer 309.

Due to the implementation of an intermediate solder layer including carbon fibers between the semiconductor chip and the lead frame, temperatures stresses in the semiconductor chip arrangement may be reduced. For example, temperature stresses in a semiconductor chip substrate or in metallic or insulating layers of the semiconductor chip, or in the lead frame connected to the semiconductor chip may be reduced.

The intermediate solder layer 309 may be similar to the preform structures described with respect to FIG. 1 or 2, and may include one or more or all of the features already described with respect to the preform structures.

The semiconductor chip of the semiconductor chip arrangement may include a chip lateral front side 312 or surface and a chip lateral back side 311 or surface, for example. A thickness of the semiconductor chip 307, e.g. a vertical distance between the chip lateral front side 312 or surface and the chip lateral back side 311 or surface may lie between 40 μm to about 800 μm, or e.g. between 40 μm to about 200 μm, or e.g. between 40 μm to about 150 μm.

A front side 312 or surface of the chip may be a surface of the substrate towards metal layers, insulation layers and/or passivation layers on top of the surface of the substrate or a surface of one of these layers. For example, more complex structures may be located at the chip front side 312 than at the chip back side 311. For example, in a power semiconductor chip, a chip front side 312 may be a side of the chip at which a first source/drain region and a gate region are formed. For example, copper metallic layers (e.g. power copper layers) may be formed over a chip front side 312. For example, the semiconductor chip may include copper metal layers e.g. power Cu, which may be about 7 μm thick, or e.g. 3 μm to 10 μm, or e.g. between 5 μm to 10 μm thick, for example. The power copper may be formed on the chip substrate front side 312 and may cover about half or more of a front side surface of the semiconductor chip. The semiconductor chip may further include an insulating borophosphosilicate glass (BPSG) layer which may be formed at the chip front side 312, and which may be used for providing electrical insulation between the metallic layers of the semiconductor chip. The BPSG layer may be about 1.5 μm thick, for example. The BPSG may have a thickness which lies between 0.5 μm to 10 μm, or e.g. between 1 μm to 5 μm, or e.g. between 1 μm thick to 3 μm, for example.

The chip back side 311 may be a side of the chip at which a second source/drain region is formed. For example, the semiconductor chip 307 may include one or more chip back side metallization layers formed over the chip back side 311. A chip back side metallization layer may include copper or any other suitable electrically conductive material, for example. For example, a copper layer may be formed over a chip back side 311, e.g. a copper layer which may be about 2 μm thick, and may provide bow compensation for a diffusion solder.

The lead frame 308 may be an electrically conductive lead frame, which may be electrically connected to a lateral back side 311 of the semiconductor chip 307. The semiconductor chip 307 may be soldered to the lead frame 308 via the intermediate solder layer 309, e.g. which may be a preform structure. For example, a back side 311 of the chip may be soldered to the lead frame 308 via the intermediate layer 309. For example, the intermediate solder layer 309 may be arranged between the semiconductor chip 307 and the lead frame 308, and may be soldered to the semiconductor chip 307, (e.g. via the chip back side metallization layer), and the lead frame 308. For example, a first lateral side of the intermediate solder layer 309 may be soldered to a semiconductor chip 307 and a second lateral side of the intermediate solder layer 309 may be soldered to the lead frame 308. A total thickness of the intermediate solder layer 309 and lead frame 308 may be about 1 mm, or e.g. greater than 1 mm, for example.

The surface area of a lateral side or surface of the intermediate solder layer 309 shown in FIG. 3, may be larger than a surface area of the lateral side or surface of a semiconductor chip of the semiconductor chip arrangement to be soldered, for example. For example, a length of one (or each) lateral side of the intermediate solder layer 309 may be about 10 μm or e.g. about 20 μm, or e.g. about 50 μm larger than a length of one (or each) lateral side of the semiconductor chip.

The semiconductor chip 307 may also be thermally connected to the lead frame 308 through the intermediate solder layer 309. The intermediate solder layer 309 may have a thermal conductivity greater than about 100 W/mK, and may also have a coefficient of thermal expansion (CTE) close to that of a silicon substrate, e.g. which may be about $2.7 \times 10^{-6}$ $K^{-1}$.

For example, table 1 shows the behavior of examples of preform structures (or solder pads) according to embodiments. Numerical calculations and analytical solutions of the temperature stress experienced in thin circular plates and materials values of macroscopic metals and glasses of semiconductor chip arrangement are shown.

A semiconductor chip arrangement (e.g. 300), may include a semiconductor chip. The semiconductor chip may include a silicon substrate, for example, having a thickness of about 40 μm. The semiconductor chip may further include BPSG (borophosphosilicate glass) which may be about 1.5 μm thick for example. The semiconductor chip may also include a copper metal e.g. power Cu, which may be about 7 um thick which covers half of the surface and formed on the chip substrate front side. On the chip substrate or wafer back side, a copper layer may be formed, e.g. a copper layer which may be about 2 μm thick, which may provide bow compensation for a diffusion solder. For simplicity, no cryogenic processes are assumed, although in practice, such processes may optionally be carried out. The copper layers may be assumed to be formed from pure copper which becomes rigid and strictly obeys Hooke's law below 100° C., for example. The BPSG may be assumed to be strictly elastic under 400° C., for example. The chip may be assumed to be soldered on a preform of composite material comprising 50-50 copper/graphite, for example. The preform may be assumed to have a variable thickness, wherein the total thickness of preform and lead frame was assumed to be approximately 1 mm.

The stress values are shown in MPa in Table 1 and positive values indicate compressing stress and negative values indicate tensile stress, which may be the largest stress carried within one layer.

TABLE 1

| Max Preform (μm) | Stress (MPa) | | | | | |
| --- | --- | --- | --- | --- | --- | --- |
| | Power-Cu | BPSG | Substrate | BS-Metal | Preform | Leadframe |
| Only wafer (without solder) | −98 | 36 | 45 | −285 | | |
| 0 (diffusion solder directly on copper) | 73 | 260 | 286 | −126 | −70 | |
| 200 | −26 | 152 | 182 | −207 | 113 | −117 |
| 400 | −119 | 51 | 83 | −287 | 110 | −110 |
| 600 | −152 | 10 | 41 | −311 | 128 | −90 |
| All composite | 32 | 60 | 78 | 71 | −22 | −15 |

Through the use of carbon fiber composite preform structures (e.g. C—Cu) and through the choice of the thickness of the carbon fiber-composite preform structures, the temperature stress of the substrate or the power Cu may be protected. A possible thickness for the carbon fiber composite preforms may be between 200 μm and 400 μm, for example. Minimal temperature stress of the substrate and the power cu may be achieved with carbon fiber composite preforms having thicknesses between 200 μm and 400 μm, for example.

By using materials which have a CTE close to silicon, temperature stresses may be reduced. For example, heat-pressed lead frames which include carbon-fiber-copper composite material may be used, wherein through a strongly reduced CTE, the temperatures stresses caused by solders may be reduced. Table 1 also shows a case of the power copper being replaced by a screen printed graphite paste, whose spaces between conceivably filled with electrolytic copper, and of the lead frame being replaced by a carbon composite lead frame (line shown as all composite). As shown, if any thick metal layers were to be replaced with composite materials, the temperature stress may fall dramatically. Taking into account the cost considerations related to the use of carbon fiber composites, the embodiments described herein affordably and effectively mitigate the temperatures stresses on a semiconductor chip of a semiconductor chip arrangement.

More details and aspects are mentioned in connection with the embodiments described above or below (e.g. the preform structure, the intermediate solder layer, the semiconductor chip arrangement, the carbon fiber composite sheet, the electrically conductive layer, the lateral sides of the carbon fiber composite sheet and the solder layer). The embodiment shown in FIG. 3 may comprise one or more optional additional features corresponding to one or more aspects mentioned in connection with the proposed concept or one or more embodiments described above (e.g. FIG. 1 or 2) or below (e.g. FIGS. 4 to 5C).

FIG. 4 shows a flow chart of a method 400 for forming a preform structure for a semiconductor chip arrangement according to an embodiment.

The method 400 may include heat-pressing 410 carbon fibers and a supplementary material to obtain a carbon fiber composite sheet.

The method 400 may further include forming 420 a preform structure based on the carbon fiber composite sheet.

Due to the heat pressing of carbon fibers to form a carbon fiber composite sheet, a thermally conductive and compact carbon fiber composite sheet including a network of carbon fibers may be produced. Furthermore, a preform structure comprising the carbon fiber composite sheet may reduce temperatures stresses when used for soldering semiconductor chip arrangements. For example, temperature stresses in a semiconductor chip substrate, in metallic or insulating layers of the semiconductor chip, or in a lead frame of a semiconductor chip arrangement may be reduced.

The carbon fibers used to form the carbon fiber composite sheet may include pitch phase carbon fibers for example, which may have high thermal conductivity (e.g. greater than 2000 W/mK) compared to Polyacrylonitrile (PAN) carbon fibers which have high tensile strength, but poor thermal conductivity. The carbon fibers may have an average diameter which lies between 5 μm and 15 μm, or e.g. between 5 μm and 10 μm. The carbon fibers may have an average length which lies between 200 μm and 600 μm, or e.g. between 200 μm and 500 μm, or e.g. between 250 μm and 480 μm.

The supplementary material may include copper powder, which may have a purity of greater than 90%, or e.g. greater than 99%, for example. The carbon fibers and the copper powder may be mixed together to form a substantially homogeneous mixture. Alternatively or additionally, the supplementary material may include copper or chromium plated onto the carbon fibers. The carbon fibers may be pre-plated with at least one of chromium or copper, for example.

The carbon fibers and the supplementary material may be heat-pressed at a temperature greater than about 1000° C. to form a wafer-like carbon fiber composite sheet or core, e.g. using a rapid hot pressing technique. The mixture of carbon fibers and supplementary material may be heat-pressed at pressures greater than about 2000 psi, 3000 psi, or 4000 psi, for example. The heat-pressed supplementary material, e.g. copper or chromium, may improve adherence of the carbon fibers to each other resulting in a wafer-like heat-pressed carbon fiber composite sheet, for example. The heat-pressed carbon fiber composite sheet may have a thickness which lies between 50 µm to 250 µm, e.g. between 50 µm to 200 µm, or e.g. between 100 µm to 175 µm.

The method 400 may further include depositing an electrically conductive layer over at least one of a first lateral side and a second lateral side of the carbon fiber composite sheet. The electrically conductive layer may include copper (or any other suitable metal or material) or may be a copper layer, for example, and may be deposited electrolytically over or directly on the first lateral side and/or the second lateral side of the carbon fiber composite sheet. For example, the electrically conductive layer may cover at least partially or completely the first lateral side and the second lateral side of the carbon fiber composite sheet. The electrically conductive layer may have a thickness which lies between 4 µm to 10 µm, or e.g. between 5 µm to 7 µm, for example.

The method 400 may further include smoothing the surface of the electrically conductive layer. The smoothing of the surface of the electrically conductive layer may be carried out by chemical mechanical polishing, for example. The smoothing may be carried out to ensure that a surface roughness of the eventual preform structure may be less than about 2 µm, or e.g. less than about 1.5 µm, or e.g. less than about 1 µm, or may have a surface roughness close to (e.g. within +/−20% of, or e.g. within +/−10% of) the surface roughness of a material to which the preform structure will be soldered.

Subsequently, a solder layer or a solder layer stack may be deposited over the electrically conductive layer, for example. A solder layer may include gold-tin or silver-tin, for example. For example, first an intermediate layer of tin may be formed over or directly on the electrically conductive layer. Subsequently, a further intermediate layer of silver and/or gold which may protect against corrosion may be formed over or directly on the intermediate layer of tin.

Due to the smoothing of the surface of the electrically conductive layer, a surface roughness of the solder layer formed over the carbon fiber composite sheet and an eventual surface roughness of the preform structure may be less than 2 µm, or e.g. less than 1 µm. For example, a preform structure whose top and/or bottom surfaces have close to or about the same (e.g. within +/−20%, or e.g. within +/−10%) surface roughness as normal lead frames may be produced.

The method 400 may further include individualizing the carbon fiber composite sheet including one or more additional layers (e.g. the electrically conductive layer and the solder layer including any intermediate layers) into a plurality of preform structures. Each preform structure may be formed based on the carbon fiber composite sheet by individualizing or dicing the carbon fiber composite sheet into preform structures having predetermined lateral dimensions, for example, so that a surface area of a lateral side or surface of the preform structure may be equal to, larger or smaller than a surface area of a lateral side or surface of a semiconductor chip to be soldered.

Subsequently, the preform structure may be soldered to a semiconductor chip and/or a lead frame, to form a joint (e.g. a permanent joint) between the preform structure and the semiconductor chip and/or the lead frame, and to provide a thermal and electrical connection between the semiconductor chip and/or the lead frame.

More details and aspects are mentioned in connection with the embodiments described above or below (e.g. the preform structure, the semiconductor chip arrangement, the carbon fiber composite sheet, the electrically conductive layer, the lateral sides of the carbon fiber composite sheet and the solder layer). The embodiment shown in FIG. 4 may comprise one or more optional additional features corresponding to one or more aspects mentioned in connection with the proposed concept or one or more embodiments described above (e.g. FIGS. 1 to 3) or below (e.g. FIGS. 5 to 5C).

Figure 5A:
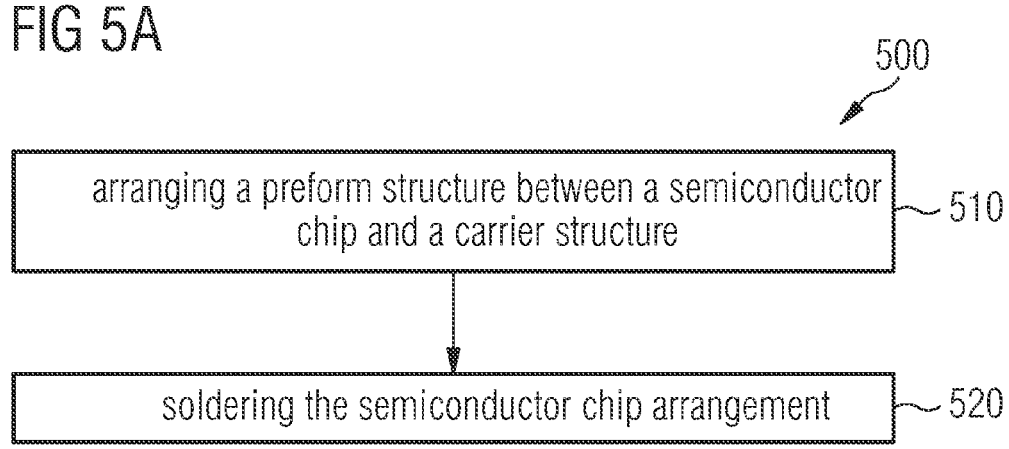
FIG. 5A shows a flow chart of a method for soldering a semiconductor chip arrangement.

FIG. 5A shows a flow chart of a method 500 for soldering a semiconductor chip arrangement according to an embodiment.

The method 500 includes arranging 510 a preform structure between a semiconductor chip and a carrier structure. A surface area of a lateral side of the preform structure is smaller than a surface area of a lateral side of the semiconductor chip.

The method 500 further includes soldering 520 the semiconductor chip arrangement.

Due to the arrangement of a preform structure having a smaller lateral size than the lateral size of a semiconductor chip between the semiconductor chip and the carrier structure, wetting of the side walls of the semiconductor chip due to the eutectic mixing of tin and copper during the soldering of the semiconductor chip arrangement may be reduced or prevented, for example.

The preform structure may include a carbon fiber composite sheet and a solder layer formed over the carbon fiber composite sheet, for example. The soldering may be done by diffusion soldering, for example.

Figure 5B:
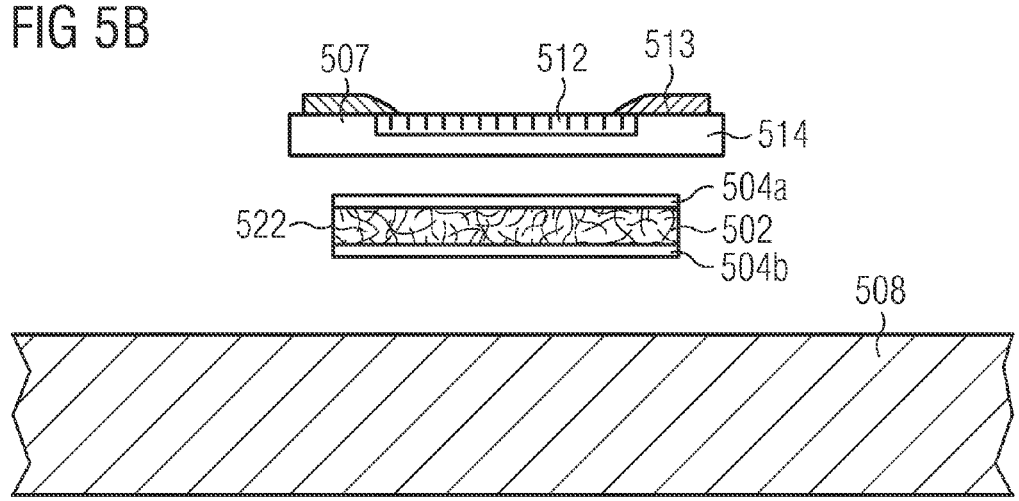
FIG. 5B shows a schematic illustration of a semiconductor chip arrangement before diffusion soldering.

FIG. 5B shows a semiconductor chip 507, a preform structure 522 and a lead frame 508 before soldering (e.g. before diffusion soldering). The preform structure 522 may be similar to the preform structures 100, 200, for example.

The preform structure 522 or solder structure may include a carbon composite sheet already pre coated with tin on at least one or both sides. For example, the preform structure 522 may include a carbon fiber composite sheet 502 which may include carbon fibers and copper. The preform structure 522 may include a pre-coated first solder layer 504a (comprising tin, e.g. Au—Sn or Ag—Sn) formed over a first lateral side of the carbon fiber composite sheet 502 and a second solder layer 504b formed over a second lateral side of the carbon fiber composite sheet 102, for example.

A surface area of a lateral side or surface of the preform structure 522 may be smaller than a surface area of the lateral side or surface of a semiconductor chip 507 of the semiconductor chip arrangement to be soldered, for example. For example, a length of one (or each) lateral side of the preform structure 522 may be about 10 µm to 20 µm smaller than one (or each) length of a lateral side of the semiconductor chip. For example, a lateral size of the preform structure 522 may be smaller than 99%, or e.g. smaller than 95%, or e.g. smaller than 90% of the lateral size of the semiconductor chip.

The semiconductor chip 507 may include a power electronic component which may include an n-type (or p-type) material substrate 514 with p-type (or n-type) diffusion zones, for example. The power electronic component may have an operating voltage of greater than about 10 V or e.g. greater than about 100V, for example, and may conduct or switch currents greater than about 1 A, or e.g. greater than about 10 A. The semiconductor chip 507 may include a cell structure 512 or an active area, and a high voltage edge region 513, for example.

Figure 5C:
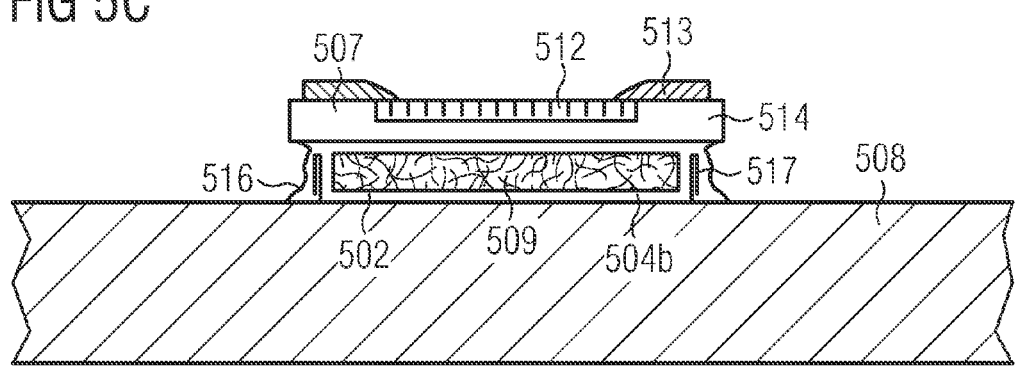
FIG. 5C shows a schematic illustration of a further semiconductor chip arrangement.

As shown in FIGS. 5B and 5C, the semiconductor chip 507 may be arranged over the lead frame 508 with the preform structure 522 between the semiconductor chip 507 and the lead frame 508. For example, the preform structure 522 may be arranged between a main (e.g. bottom) surface of the semiconductor chip 507 and a lateral surface of the lead frame 508.

Due to the smaller lateral size or surface area of the preform structure 522 compared to the semiconductor chip 507, a side groove or notch 517 may be formed at the side walls of the preform structure 522. For example, the preform structure 522 may be arranged so that a groove (e.g. 517) having a width of about 10 µm to 20 µm extending from the peripheries of the semiconductor chip to the peripheries of the preform structure surrounds the preform structure. For example, the side groove or notch 517 may be a hollow or concave region (or undercut region) and may be formed in the regions where the surface area of the preform structure 522 is smaller than or undercuts a surface area of the lateral surface of the semiconductor chip 507. The geometry of the side groove 517 may be defined by planar surface regions of the lead frame 508 to which the semiconductor chip 507 will be soldered, a side wall of the preform structure 522 and planar surface regions of the semiconductor chip 507 to be soldered to the lead frame, for example. The side groove 517 may surround (e.g. completely surround) the preform structure 522, for example.

As the soldering process begins, the liquefied mixture (which may include a liquefied solder layers 104a and 104b, e.g. a eutectic mixture of tin and copper) may at least partially fill the side groove 517 at the chip surface region (e.g. planar surface regions of the semiconductor chip to be soldered to the lead frame) instead of creeping on to the side walls of the chip.

FIG. 5C shows the semiconductor chip arrangement 500 after diffusion soldering. The semiconductor chip arrangement 500 may include the semiconductor chip 507, an intermediate solder layer 509 (from the preform structure 522) and the lead frame 508 after diffusion soldering. The semiconductor chip 507 may be diffusion soldered on to a lead frame to reduce the temperature stress, for example. After soldering, the reformed solder may fill or at least partially fill the side groove 517, whereby due to the surface stress and/or interfacial energies, a meniscus may be formed, for example.

Due to the implementation of using a preform structure having a smaller lateral size than the lateral size of a semiconductor chip, wetting of the side walls of the semiconductor chip due to the eutectic mixing of tin and copper during the diffusion soldering of semiconductor chips may be reduced or prevented, for example. Crystal defects of copper silicate, may also be reduce or prevented, for example. Due to the formation of a groove structure, chips or large semiconductor chips may be diffusion soldered to copper lead frames or direct copper bonded (DCB) printed circuit boards, and liquefied eutectic mixtures may flow into the side groove structures instead of creeping onto the side walls of the chip while holding down the chip. Furthermore, additional structuring of the copper lead frames or DCBs to create additional grooves in the lead frames or DCBs may no longer be necessary, for example. In addition, a reduction of temperature stress may be achieved after the solidification of the solder e.g. due to the presence of the carbon fiber composite sheet in the intermediate solder layer, for example.

More details and aspects are mentioned in connection with the embodiments described above or below (e.g. the preform structure, the intermediate solder layer, the semiconductor chip arrangement, the carbon fiber composite sheet, the electrically conductive layer, the lateral sides of the carbon fiber composite sheet, the solder layer and the lead frame). The embodiment shown in FIGS. 5A to 5C may comprise one or more optional additional features corresponding to one or more aspects mentioned in connection with the proposed concept or one or more embodiments described above (e.g. FIG. 1 to 4) or below.

Various embodiments relate to a preform of carbon fiber copper composite material. The preform structures or solder pads from carbon fiber-copper composite material may have a thickness of about 50 to 250 um, and their top and/or bottom surfaces may have the same roughness as normal lead frames. The preform structures or solder pads may be produced and applied to semiconductor chip arrangements and may be an alternative to molybdenum pads. Such preform structures or solder pads may achieve a gradual increase in the CTE between chip and lead frame and a reduction in temperature stress. Furthermore, they may provide a possibility for larger chip to be diffusion soldered. By depositing a gold-tin (Au—Sn) layer on a side, a preform structure may be formed which may be diffusion soldered on a copper lead frame, for example. An Au—Sn layer on the backside of the chip may ensure a diffusion solder between the chip and the preform, for example. By depositing another Au—Sn layer on both sides, a preform may be achieved which can be diffusion soldered on both sides.

Various embodiments relate to heat pressing a wafer-like core of carbon fibers, mixed with pitch fibers and copper power, or from chromium pre plated or copper plated fibers. Both sides of the wafer-like core may be electrolytic deposited with copper. Chemical mechanical polishing may be carried out to smooth the copper surface. The finishing of one or both surfaces may be carried out by depositing tin and corrosion protection for diffusion soldering. e.g. by Au—Sn or Ag—Sn. An individualization of the preform wafer-like core may be carried out to produce solder pads which are slightly larger than the individual chips. The solder pads for diffusion soldering onto silicon chips may include a wafer-like core of heat pressed carbon fiber copper composite material and have one or two diffusion solderable surfaces with a surface roughness of clearly less than 1 µm. In particular, the preform for diffusion soldering of silicon chips onto copper lead frames may include or consist of heat pressed copper fibers-copper composite material, for example. Both sides of the surfaces may like-wise be covered with the diffusion solderable gold-tin or silver-tin layer which protects against corrosion.

Various embodiments relate to a self-adjusted solder groove using a preform including or made from sintered carbon fiber composites. Various embodiments are also related to assembling power electronic components using a carbon composite (e.g. C—Cu) preform solder structure. The preform structure may be smaller than the chip and a substantial portion of the liquid may fill a groove at the side or sidewalls of the pressed solder structure.

Interlaying arrangements of Molybdenum pads may provide a gradual transition of the CTE through an assembly of laterally diffusion metal oxide semiconductor (LDMOS) chips for mobile phones in the Gigahertz range, for example. While a cold electrolytic process may have been used to produce composite materials on the wafer, the adhesiveness of electroless deposited copper on carbon fibers is gained through heat press processes. An electrolytic, or screen printing pre-treatment of the carbon fibers may be provided with an adhesive metal layer, e.g. chrome. Furthermore, occasionally other factors may stand in the way of carrying out a pre-treatment of such industrial quality.

Carbon fibers suitable for forming a carbon fiber composite sheet for a preform structure may be acquired or produced commercially at 50 Euro/kg or less, for example. Although the corresponding amount of copper based on the volume may be at least ten times as expensive, the composite material from raw materials would be only half as expensive as pure copper. For example, because of the low specific weight of the carbon fiber, the volume prices may be much lower than that of copper. Molybdenum may be unable to compete in terms of price, for example.

The usage of Palladium for the electroless deposition process of copper on the carbon fibers for heat pressing may be a reason for a high price of heat-pressed carbon-fiber copper composite materials. The costs may be considerable in cases if all copper layers were to be replaced with the carbon fiber composite material, for example. Nevertheless, the composite material may be achieved without electroless deposition of copper and the raw materials for chromium plating of the fibers may be considerably cheaper than a bath with palladium additives, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A preform structure for soldering a semiconductor chip arrangement, the preform structure comprising:
    a carbon fiber composite sheet;
    a solder layer formed over the carbon fiber composite sheet;
    an electrically conductive layer formed between the carbon fiber composite sheet and the solder layer at a first lateral side of the carbon fiber composite sheet; and
    a second electrically conductive layer formed between the carbon fiber composite sheet and a second solder layer at a second lateral side of the carbon fiber composite sheet opposite to the first lateral side of the carbon fiber composite sheet.

2. The preform structure according to claim 1, wherein the carbon fiber composite sheet comprises carbon fibers and at least one of copper or chromium.

3. The preform structure according to claim 1, wherein the carbon fiber composite sheet comprises between 50% to 80% copper or chromium.

4. The preform structure according to claim 1, wherein a surface roughness of the solder layer formed over the carbon fiber composite sheet is less than 2 µm.

5. The preform structure according to claim 1, wherein the electrically conductive layer comprises copper.

6. The preform structure according to claim 1, wherein the solder layer comprises gold-tin or silver-tin.

7. The preform structure according to claim 1, wherein the carbon fiber composite sheet has a thickness which lies between 50 µm to 250 µm.

8. The preform structure according to claim 1, wherein the preform structure has a thickness which lies between 200 µm to 400 µm.

9. A preform structure for soldering a semiconductor chip arrangement, the preform structure comprising:
    a carbon fiber composite sheet; and
    a solder layer formed over the carbon fiber composite sheet,
    wherein the carbon fiber composite sheet comprises between 50% to 80% copper or chromium.

10. A preform structure for soldering a semiconductor chip arrangement, the preform structure comprising:
    a carbon fiber composite sheet comprising carbon fibers;
    an electrically conductive layer comprising copper formed on a lateral side of the carbon fiber composite sheet and extending along the lateral side of the carbon fiber composite sheet; and
    a solder layer formed over the electrically conductive layer.

* * * * *